(12) United States Patent
Wilkes et al.

(10) Patent No.: US 7,365,289 B2
(45) Date of Patent: Apr. 29, 2008

(54) PRODUCTION OF NANOSTRUCTURES BY CURIE POINT INDUCTION HEATING

(75) Inventors: Jon Gardner Wilkes, Little Rock, AR (US); Dan Alexander Buzatu, Little Rock, AR (US); Dwight Wayne Miller, Whitehall, AR (US); Alexandru Sorin Biris, Little Rock, AR (US); Alexandru Radu Biris, Cluj Napoca (RO); Dan Lupu, Cluj Napoca (RO); Jerry A. Darsey, Little Rock, AR (US)

(73) Assignees: The United States of America as represented by the Department of Health and Human Services, Washington, DC (US); Board of Trustees of the University of Arkansas, Little Rock, AR (US)

(*) Notice: Subject to any disclaimer, the term of this patent is extended or adjusted under 35 U.S.C. 154(b) by 63 days.

(21) Appl. No.: 11/302,986

(22) Filed: Dec. 14, 2005

(65) Prior Publication Data

US 2007/0068933 A1   Mar. 29, 2007

Related U.S. Application Data

(63) Continuation-in-part of application No. 11/228,023, filed on Sep. 15, 2005, which is a continuation-in-part of application No. 11/131,912, filed on May 18, 2005.

(60) Provisional application No. 60/638,243, filed on Dec. 21, 2004, provisional application No. 60/611,018, filed on Sep. 17, 2004, provisional application No. 60/571,999, filed on May 18, 2004.

(51) Int. Cl.
  *H05B 6/10*   (2006.01)
(52) U.S. Cl. .................. 219/634; 977/844; 977/900
(58) Field of Classification Search ................ 219/634, 219/618, 730, 759; 118/724, 725; 977/844, 977/900; *H05B 6/10*
See application file for complete search history.

(56) References Cited

U.S. PATENT DOCUMENTS

| | | | |
|---|---|---|---|
| 6,605,266 B2 * | 8/2003 | Nesper et al. | 423/592.1 |
| 6,780,766 B2 | 8/2004 | Basceri et al. | 438/676 |
| 6,793,967 B1 | 9/2004 | Ata et al. | 427/249.1 |
| 6,939,477 B2 * | 9/2005 | Stark et al. | 252/62.54 |
| 7,163,655 B2 * | 1/2007 | Weber et al. | 264/474 |
| 2005/0175885 A1 * | 8/2005 | Imholt et al. | 429/40 |

* cited by examiner

*Primary Examiner*—Daniel Robinson
(74) *Attorney, Agent, or Firm*—Morris Manning Martin LLP; Tim Tingkang Xia, Esq.

(57) ABSTRACT

An apparatus for synthesizing nanostructures. In one embodiment, the apparatus includes a heating device that defines a reaction zone therein and a susceptor made of a ferromagnetic material with a Curie temperature and placed in the reaction zone, where the Curie temperature substantially corresponds to a temperature at which the growth of desired nanostructures occurs and the heating device is capable of heating the susceptor substantially at the Curie temperature.

17 Claims, 5 Drawing Sheets

PRODUCTION OF NANOSTRUCTURES BY CURIE POINT INDUCTION HEATING

CROSS-REFERENCE TO RELATED PATENT APPLICATION

This application is a continuation-in-part of U.S. patent application Ser. No. 11/228,023, filed Sep. 15, 2005, entitled "APPARATUS AND METHODS FOR SYNTHESIS OF LARGE SIZE BATCHES OF CARBON NANOSTRUCTURES," by Alexandru Sorin Biris, Alexandru Radu Biris, Dan Lupu, Jon Gardner Wilkes, Dan Alexander Buzatu, Dwight Wayne Miller, and Jerry A. Darsey (hereinafter the "'023 application"), the disclosure of which is hereby incorporated herein by reference in its entirety. The status of the '023 application is pending and itself claims the benefit, pursuant to 35 U.S.C. § 119(e), of U.S. provisional patent application Ser. No. 60/611,018, filed Sep. 17, 2004, entitled "APPARATUS AND METHODS FOR SYNTHESIS OF LARGE SIZE BATCHES OF CARBON NANOSTRUCTURES," by Alexandru Sorin Biris, Dan Alexander Buzatu, Alexandru Radu Biris, Jon Gardner Wilkes, Dwight Wayne Miller, Jerry A. Darsey, and Dan Lupu. The '023 application also is a continuation-in-part of U.S. patent application Ser. No. 11/131,912, filed May 18, 2005, entitled "APPARATUS AND METHODS OF MAKING NANOSTRUCTURES BY INDUCTIVE HEATING," by Alexandru Radu Biris, Dan Lupu, Alexandru Sorin Biris, Jon Gardner Wilkes, Dan Alexander Buzatu, Dwight Wayne Miller, and Jerry A. Darsey (hereinafter the "'912 application"). The status of the '912 application is pending and itself claims the benefit, pursuant to 35 U.S.C. §119(e), of U.S. provisional patent application Ser. No. 60/571,999, filed May 18, 2004, entitled "APPARATUS AND METHODS OF HIGH THROUGH-PUT GENERATION OF NANOSTRUCTURES BY INDUCTIVE HEATING AND IMPROVEMENTS INCREASING PRODUCTIVITY WHILE MAINTAINING QUALITY AND PURITY," by Alexandru Radu Biris, Dan Lupu, Alexandru Sorin Biris, Jon Gardner Wilkes, Dan Alexander Buzatu, Dwight Wayne Miller, and Jerry A. Darsey.

This application also claims the benefit, pursuant to 35 U.S.C. § 19(e), of U.S. provisional patent application Ser. No. 60/638,243, filed Dec. 21, 2004, entitled "PRODUCTION OF NANOSTRUCTURES BY CURIE POINT INDUCTION HEATING," by Jon Gardner Wilkes, Dan Alexander Buzatu, Dwight Wayne Miller, Alexandru Sorin Biris, Alexandru Radu Biris, Dan M. Lupu, and Jerry A. Darsey, which is incorporated herein by reference in its entirety.

Some references, if any, which may include patents, patent applications and various publications, are cited and discussed in the description of this invention. The citation and/or discussion of such references is provided merely to clarify the description of the present invention and is not an admission that any such reference is "prior art" to the invention described herein. All references, if any, cited and discussed in this specification are incorporated herein by reference in their entireties and to the same extent as if each reference individually incorporated by reference.

FIELD OF THE INVENTION

The present invention is generally related to the field of production of nanostructures, and, more particularly, is related to apparatus and methods for synthesizing nanostructures by inductively heating a susceptor made of a ferromagnetic material substantially at a Curie temperature associated with the ferromagnetic material.

BACKGROUND OF THE INVENTION

The production of high purity carbon nanostructures such as single wall and multi wall nanotubes and nanofibers as well as nanomaterials from other elements has been achieved by several methods, including arc discharge, pulsed laser vaporization (hereinafter "PLV"), and chemical catalytic vapor deposition (hereinafter "CCVD"). To date one promising technology for producing nanostructures is CCVD. A CCVD nanostructure reactor enables the control of most of the physical and chemical parameters that influence both the nucleation and the growth of highly pure carbon nanostructures. The important parameters for producing nanostructures include the nature and support of a catalyst, a hydrocarbon source and concentration, a flow rate and type of carrier gas, a reaction time, a reaction temperature and thermal stability in a reaction zone of a nanostructure reactor. Additionally, in order to efficiently mass-produce highly pure nanostructures at low cost, energy consumption during the heating process need to be minimized.

One of the major limitations of a conventional CCVD nanostructure reactor for nanostructure synthesis is the size of a susceptor that can be used. Large size susceptors, desirable for producing large quantities of carbon nanostructures, introduce difficulties in controlling the hydrocarbon gas flow over the catalyst powder bed and attaining tight control of a reaction temperature. Furthermore, the use of conventional ovens results in temperature gradient along the length of the oven. This temperature gradient results in varying temperature conditions that have a significant negative impact on the quality, characteristics, and purity of carbon nanostructures grown therein. Additionally, conventional ovens consume large amounts of energy and heat inefficiently.

An alternative technology for heating a reaction zone of a nanostructure reactor is inductive heating (hereinafter "IH"). IH can be easily controlled, can be focused on catalyst particles alone, and presents a uniform temperature within the reaction zone. IH also consumes significantly lower energy compared to classical heating because it mostly heats the reactants and their physical support such as a susceptor. Another advantage of IH is the time required for the catalyst particles and "susceptor" to reach the temperature of reaction is about 2 to 3 minutes, which is much shorter, compared to the about 30 minutes required for classical heating. Altogether, the time required to produce a batch of nanostructures by IH is approximately one third of the time required by using a classical oven to produce a similar batch of nanostructures.

In an IH nanostructure reactor, high purity graphite is typically formed into the shape of a boat and used as the susceptor. The susceptor boat lies within the radio frequency (hereinafter "RF") field, absorbs its energy, and heats the catalyst and other reactants. If the RF field intensity is increased, the susceptor temperature rises. Therefore, the amount of RF energy has to be carefully controlled, particularly if there are variations in power or ambient temperature. Additionally, there is the aforementioned 2 to 3 minutes of susceptor warm-up time to achieve temperature equilibrium. The length of this warm up time period and the corresponding cool down time period upon reaction completion is a function of the thermal mass of the susceptor.

Susceptor mass becomes an increasingly important synthesis bottleneck as one attempts to scale up for large scale production.

Therefore, a heretofore unaddressed need exists in the art to address the aforementioned deficiencies and inadequacies.

SUMMARY OF THE INVENTION

In one aspect, the present invention relates to an apparatus for synthesizing nanostructures. In one embodiment, the apparatus includes a heating device that defines a reaction zone therein, and a susceptor made of a ferromagnetic material having a characteristic temperature and placed in the reaction zone, where the characteristic temperature substantially corresponds to a temperature at which the growth of desired nanostructures occurs and the heating device is capable of heating the susceptor substantially at the characteristic temperature. In one embodiment, the characteristic temperature is substantially equal to a Curie temperature of the ferromagnetic material.

In one embodiment, the heating device comprises an inductively heating device. The inductively heating device includes an inductor coil. The inductor coil is electrically coupled to an alternating current (hereinafter "AC") power supply, and is configured such that, in operation, it allows an alternating current to pass through to generate an electromagnetic field with a radio frequency in the reaction zone to heat the susceptor substantially at the characteristic temperature.

The susceptor, in one embodiment, includes a foil or plate of the ferromagnetic material, where the foil or plate has a surface for nanostructures to grow on the surface. The foil or plate of the ferromagnetic material may be coated with a non-magnetic conductive material. In one embodiment, the non-magnetic conductive material comprises gold or chromium. The susceptor, in one embodiment, is mounted on an ultra-low heat conductivity/capacity insulator. The ultra-low heat conductivity/capacity insulator is made of silicate. In another embodiment, the susceptor includes a bed of powders made from the ferromagnetic material, where each of the powders is coated with a catalyst and support materials.

The apparatus may further comprise a chamber having a first end, an opposite, second end, and a body portion defined therebetween, where the heating device is formed on the exterior surface of the body portion of the chamber such that the reaction zone is defined inside the chamber.

In another aspect, the present invention relates to an apparatus for synthesizing nanostructures. In one embodiment the apparatus has a susceptor made of a ferromagnetic material having a characteristic temperature. The characteristic temperature corresponds to a temperature at which the growth of desired nanostructures occurs and is substantially equal to a Curie temperature of the ferromagnetic material. The apparatus further has a heating device for heating the susceptor substantially at the characteristic temperature.

In yet another aspect, the present invention relates to a method for synthesizing nanostructures. In one embodiment, the method includes the step of providing a nanostructure reactor having a reaction zone and a susceptor placed in the reaction zone, where the susceptor is made of a ferromagnetic material having a Curie temperature and contains a catalyst. In one embodiment, the susceptor comprises a foil or plate of the ferromagnetic material, and wherein the foil or plate has a surface for nanostructures to grow on the surface. The foil or plate of the ferromagnetic material may be coated with a non-magnetic conductive material. In another embodiment, the susceptor comprises a bed of powders made from the ferromagnetic material. Each of the powders is coated with a catalyst and support materials.

The method also includes the steps of supplying a feedstock reagent to the reaction zone, heating the susceptor to increase the temperature of the susceptor to the Curie temperature, and keeping the susceptor substantially at the Curie temperature for a period of time for the growth of desired nanostructures from the catalyst and the feedstock reagent. In one embodiment, the heating step includes the step of inductively heating the susceptor with an electromagnetic field with an RF.

The method may further include the step of optimizing the characteristic temperature for the growth of the desired nanostructures. The optimizing step comprises the step of selecting the ferromagnetic material with a Curie temperature that substantially corresponds to a temperature at which the growth of the desired nanostructures occurs. The method may also include the step of maintaining a sufficient amount of the feedstock reagent in the reaction zone.

In a further aspect, the present invention relates to a method for synthesizing nanostructures. In one embodiment, the method includes the steps of providing a susceptor containing a catalyst, where the susceptor is made of a ferromagnetic material having a characteristic temperature, and heating the susceptor substantially at the characteristic temperature for the growth of desired nanostructures from the catalyst. The heating step comprises the steps of inductively heating the susceptor to increase temperature of the susceptor to the characteristic temperature, and keeping the susceptor substantially at the characteristic temperature for a period of time for the growth of the desired nanostructures. In one embodiment, the inductively heating step is performed with an electromagnetic field with an RF. In one embodiment, the method further includes the step of supplying a feedstock reagent. The method may also include the step of optimizing the characteristic temperature for the growth of the desired nanostructures, where the optimizing step includes the step of selecting the ferromagnetic material with a Curie temperature that substantially corresponds to a temperature at which the growth of the desired nanostructures occurs.

In yet a further aspect, the present invention relates to a method for synthesizing nanostructures. In one embodiment, the method includes the step of heating a susceptor containing a catalyst substantially at a characteristic temperature at which the growth of desired nanostructures occurs, where the susceptor is made of a ferromagnetic material with a Curie temperature that is substantially equal to the characteristic temperature. The heating step comprises the steps of inductively heating the susceptor to increase temperature of the susceptor to the characteristic temperature, and keeping the susceptor substantially at the characteristic temperature for a period of time for the growth of the desired nanostructures. In one embodiment, the inductively heating step is performed with an electromagnetic field with an RF. The method further includes the step of supplying a feedstock reagent to the susceptor.

These and other aspects of the present invention will become apparent from the following description of the preferred embodiment taken in conjunction with the following drawings, although variations and modifications therein may be affected without departing from the spirit and scope of the novel concepts of the disclosure.

BRIEF DESCRIPTION OF THE DRAWINGS

The accompanying drawings illustrate one or more embodiments of the invention and, together with the written description, serve to explain the principles of the invention. Wherever possible, the same reference numbers are used throughout the drawings to refer to the same or like elements of an embodiment, and wherein.

DETAILED DESCRIPTION OF THE INVENTION

The present invention is more particularly described in the following examples that are intended as illustrative only since numerous modifications and variations therein will be apparent to those skilled in the art. Various embodiments of the invention are now described in detail. Referring to the drawings FIGS. 1-5, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention. Additionally, some terms used in this specification are more specifically defined below.

DEFINITIONS

The terms used in this specification generally have their ordinary meanings in the art, within the context of the invention, and in the specific context where each term is used.

Certain terms that are used to describe the invention are discussed below, or elsewhere in the specification, to provide additional guidance to the practitioner in describing the apparatus and methods of the invention and how to make and use them. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that the same thing can be said in more than one way. Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification, including examples of any terms discussed herein, is illustrative only, and in no way limits the scope and meaning of the invention or of any exemplified term. Likewise, the invention is not limited to various embodiments given in this specification. Furthermore, subtitles may be used to help a reader of the specification to read through the specification, which the usage of subtitles, however, has no influence on the scope of the invention.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, "catalytic chemical vapor deposition method" or "CCVD" refers to a method in the art to synthesize fullerenes and carbon nanotubes by using acetylene gas, methane gas, or the like that contains carbon as a raw material, and generating carbon nanotubes in chemical decomposition reaction of the raw material gas. Among other things, the chemical vapor deposition depends on chemical reaction occurring in the thermal decomposition process of the methane gas and the like serving as the raw material, thereby enabling the manufacture of carbon nanotubes having high purity.

As used herein, "carbon nanostructures" refer to carbon fibers or carbon nanotubes that have a diameter of 1 µm or smaller which is finer than that of carbon fibers. However, there is no particularly definite boundary between carbon fibers and carbon nanotubes. By a narrow definition, the material whose carbon faces with hexagon meshes are almost parallel to the axis of the corresponding carbon tube is called a carbon nanotube, and even a variant of the carbon nanotube, around which amorphous carbon exists, is included in the carbon nanotube.

As used herein, "single wall nanotube" and its acronym "SWNT" refer to a carbon nanotube having a structure with a single hexagon mesh tube (graphene sheet).

As used herein, "multi-wall nanotube" and its acronym "MWNT" refer to a carbon nanotube made of multilayer graphene sheets.

As used herein, "carbon nanotubes" refers to several of SWNTs, MWNTs, or a combination of them.

As used herein, "Curie temperature" or "Curie point" refers to a characteristic property of a ferromagnetic material. The Curie temperature of a ferromagnetic material is the temperature above which it loses its characteristic ferromagnetic ability to possess a net (spontaneous) magnetization in the absence of an external magnetic field. At temperatures below the Curie temperature, the magnetic moments are partially aligned within magnetic domains in ferromagnetic materials. As the temperature is increased from below the Curie temperature, thermal fluctuations increasingly destroy this alignment, until the net magnetization becomes zero at and above the Curie temperature. Above the Curie temperature, the material is purely paramagnetic.

As used herein, "reaction zone" refers to a three-dimensional zone inside a nanostructure reactor where hydrocarbon molecules are heated to produce carbon molecules.

DESCRIPTION OF THE PREFERRED EMBODIMENTS

Nanostructure reactors that implement CCVD methods to produce carbon nanostructures require that hydrocarbon molecules be deposited on a heated catalyst material. The catalyst is typically used to disassociate the hydrocarbon molecules. Using hydrocarbons as a carbon source, the hydrocarbons flow into a reaction zone of a nanostructure reactor, where the hydrocarbons are heated at a high temperature. The dissociation of the hydrocarbon breaks the hydrogen bond, thus producing pure carbon molecules. The important parameters that influence the growth of carbon nanostructures are, among other things, the nature and support of the catalyst, the hydrocarbon source and concentration, the flow rate and type of carrier gas, the time of reaction, the temperature of reaction and the thermal stability in the reaction zone.

The present invention relates to apparatus and methods for synthesizing high quality and purity nanostructures with large quantities by, among other things, inductively heating a susceptor made of a ferromagnetic material to a Curie temperature of the ferromagnetic material and keeping the susceptor substantially at the Curie temperature for a period of time. The Curie temperature substantially corresponds to a temperature at which the growth of desired nanostructures occurs.

Without intent to limit the scope of the invention, various embodiments of the present invention are described below.

The present invention, in one aspect, relates to a method for synthesizing nanostructures. The method in one embodiment includes the following steps: at first, a nanostructure reactor having a reaction zone and a susceptor placed in the reaction zone is provided, where the susceptor is made of a ferromagnetic material with a Curie temperature and contains a catalyst. A feedstock reagent and/or carrier gas is supplied to the reaction zone. Then, the susceptor is heated to increase its temperature to the Curie temperature and kept substantially at the Curie temperature for a period of time for the growth of desired nanostructures from the catalyst and the feedstock reagent.

The nanostructure reactor may or may not include a chamber. The susceptor can be formed in the form of a foil or plate of the ferromagnetic material. The foil or plate of the ferromagnetic material may be coated with a non-magnetic conductive material. The susceptor can also be formed in the form of powders that are made of the ferromagnetic material. Each of the powders is coated with a catalyst and support materials. The susceptor can also be formed in other forms. The susceptor is heated by an inductive heating device such as an inductive coil for generating an RF field in the reaction zone in which the susceptor is placed.

The method may further include the step of selecting the ferromagnetic material with a Curie temperature that substantially corresponds to a temperature at which the growth of desired nanostructures occurs so as to optimize the temperature for the growth of the desired nanostructures. The method may also include the step of maintaining a sufficient amount of the feedstock reagent and/or carrier gas in the reaction zone.

Figure 1:
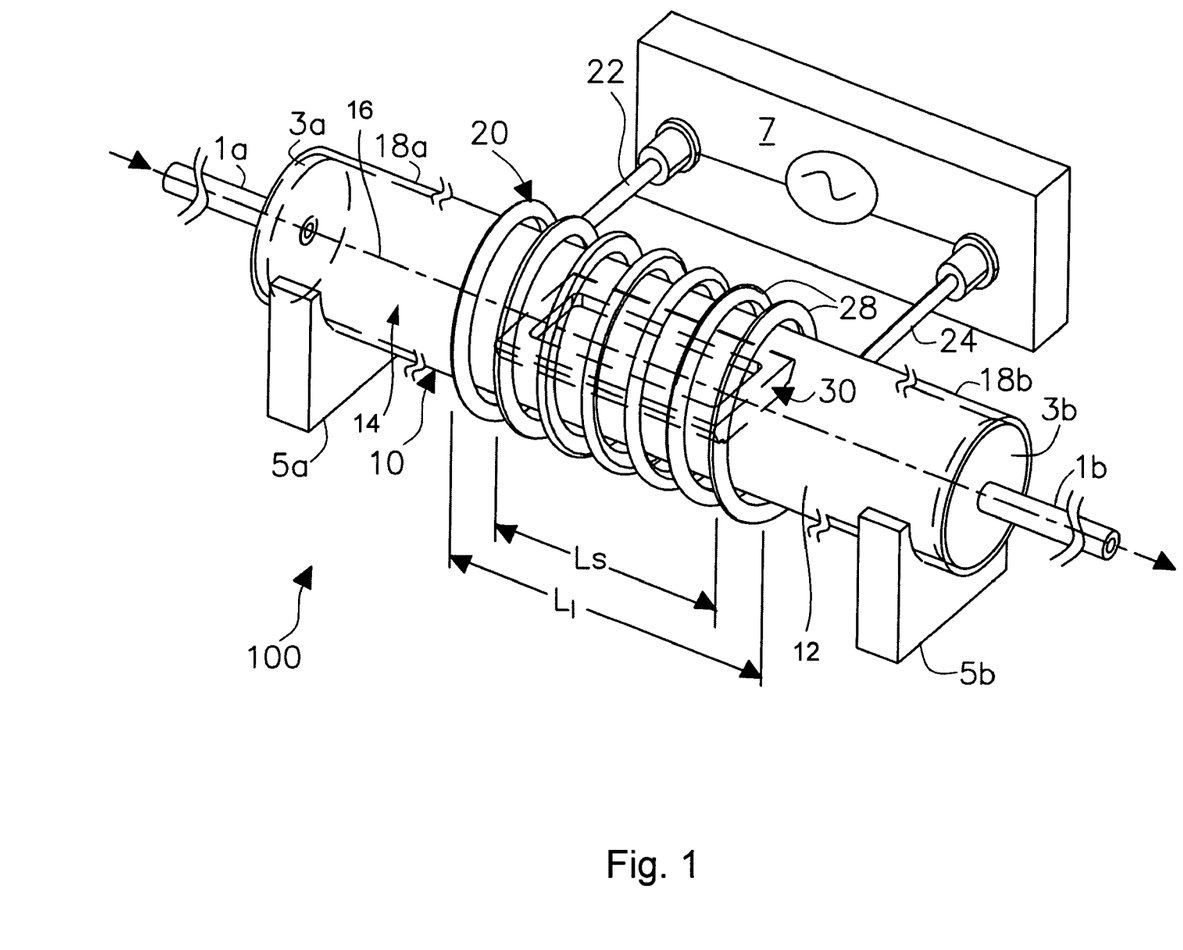
FIG. 1 shows schematically a perspective view of an apparatus for synthesizing nanostructures according to one embodiment of the present invention.
Figure 2:
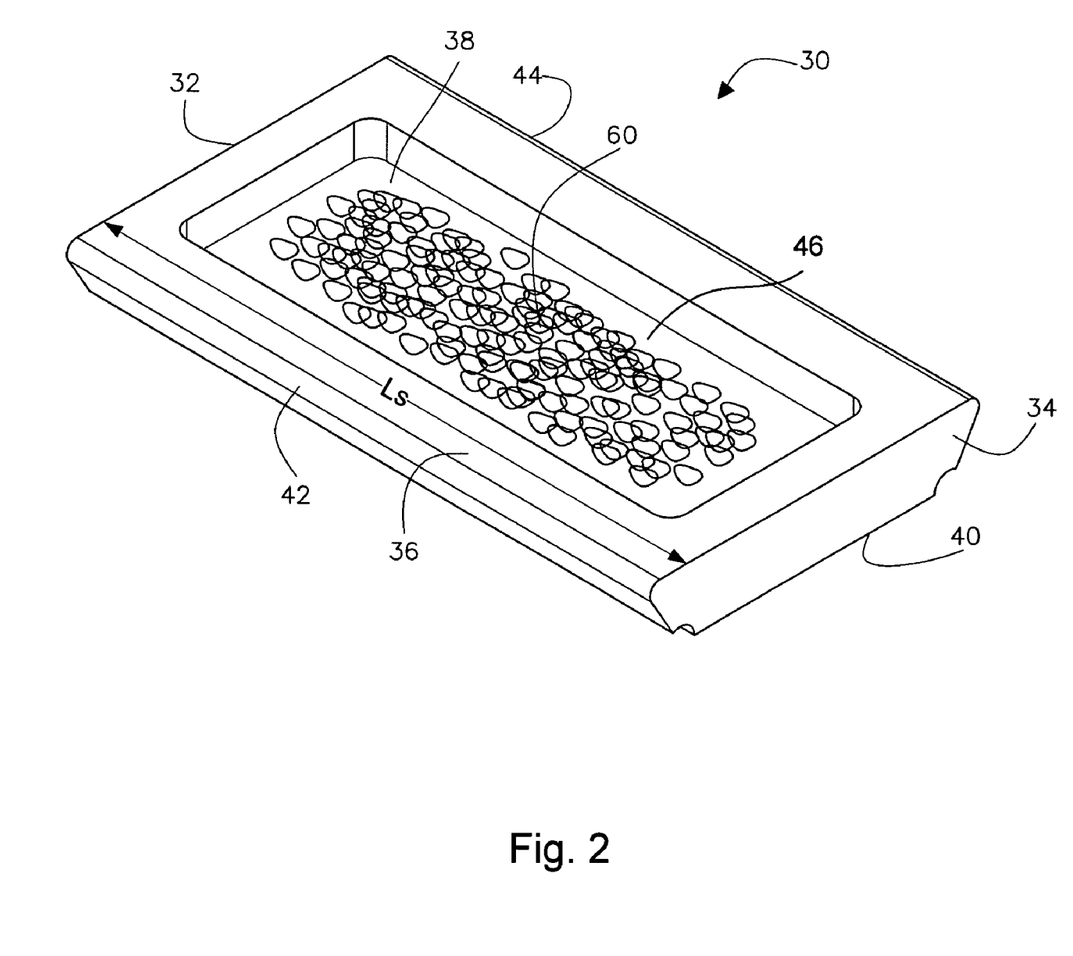
FIG. 2 shows schematically a perspective view of a susceptor according to one embodiment of the present invention.

In another aspect, the present invention relates to an apparatus for synthesizing nanostructures. Referring now to FIGS. 1 and 2, an apparatus 100 for synthesizing nanostructures according to one embodiment of the present invention is shown. The apparatus 100 has a cylindrical process chamber 10 having a body portion 12 defining a bore 14 with an axis 16 therein, an inductively heating device 20 in the form of inductor coils 28 formed on the exterior surface of the chamber 10, thereby defining a reaction zone inside the bore 14, and a susceptor 30 placed in the reaction zone.

The cylindrical process chamber 10 further has a first end 18a and an opposite, second end 18b. The body portion 12 of the cylindrical process chamber 10 is located between the first end 18a and the second end 18b. The first end 18a and the second end 18b may be sealed by a first seal 3a and a second seal 3b, respectively. An inlet tube 1a can be used for interconnecting through the first seal 3a to establish a fluid communication with the bore 14 of the cylindrical process chamber 10, and an outlet tube 1b can be used for interconnecting through the second seal 3b to establish a fluid communication with the bore 14 of the cylindrical process chamber 10, respectively. Inlet tube 1a and outlet 1b are used to transport carbon feedstock and/or carrier gases in to and out from the bore 14 of the cylindrical process chamber 10, among other things. Inlet tube 1a and outlet 1b may also be connected to other control device(s) (not shown) that are adapted for maintaining a sufficient amount of the carbon feedstock and/or carrier gases in the reaction zone in the bore 14 of the cylindrical process chamber 10. Additional inlet(s) and/or outlet(s) may also be utilized.

As shown in FIG. 1, the cylindrical process chamber 10 is held by holders 5a and 5b at the first end 18a and the second end 18b, respectively. Other types of holding means such as one or more hangers may also be used.

The process chamber 10 can also be formed in other geometric shapes. For example, the process chamber 10 can be spherical. The cylindrical process chamber 10 can be made of a substantially non-conductive material such glass. In one embodiment, the cylindrical process chamber 10 is substantially made of quartz. The cylindrical process chamber 10 may be made of other types of materials including non-magnetic conductive materials.

The inductively heating device 20, as shown in FIG. 1, is in the form of an inductive coil 28 that is substantially uniformly surrounding the exterior surface of the body portion 12 of the cylindrical process chamber 10 and defines a reaction zone inside the bore 14 of the cylindrical process chamber 10 with a longitudinal length $L_1$. The inductive coil 28 is positioned in relation to the body portion 12 of the cylindrical process chamber 10 such that there is a distance between the inductive coil 28 and the exterior surface of the body portion 12 of the cylindrical process chamber 10, and the distance can be any value in the range of 0 to 10 cm.

The inductive coil 28 can be made from at least one of metals, alloys, and conducting polymeric materials. In one embodiment, the inductive coil 28 is substantially made from copper. The inductive coil 28 is electrically coupled to an AC power supply 7 through a first end 22, and a second end 24, respectively. For example, a high or RF frequency generator can be used as an AC power supply 7. The inductive coil 28 is configured such that, in operation, it allows an alternating current to pass through to generate an electromagnetic field with an RF in the reaction zone to heat the susceptor 30 substantially at the characteristic temperature.

Other types of inductive heating devices can also be utilized to practice the current invention.

As shown in FIG. 2, the susceptor 30 has a first end portion 32 and an opposite, second end portion 34 defining a body portion 36 with a longitudinal length $L_s$ therebetween. The body portion 36 defines a recess 46 with a supporting surface 38 for supporting a catalyst 60. The supporting surface 38 can be flat, sloped, or curved. The body portion 36 of the susceptor 30 is formed with a bottom surface 40, a first side surface 42, and a second, opposite side surface 44. Alternatively, the body portion 36 can be formed such that the supporting surface 38 is the tope surface of the body portion 36.

The body portion 36 of the susceptor 30 is formed such that when the susceptor 30 is positioned in the reaction zone in the bore 14 of the cylindrical process chamber 10, there is at least one space formed between the supporting surface 38 and the inner surface of the body portion 12 for facilitating fluid communication inside the bore 14 of the cylindrical process chamber 10 and allowing nanostructures to grow on the supporting surface 38.

The longitudinal length $L_1$ of the reaction zone and the longitudinal length $L_s$ of the susceptor 30 satisfy the following relationship:

$$L_s < L_1,$$

which allows the susceptor 30 to be uniformly heated during an operation. However, the present invention can be practiced with the relationship $L_s \geq L_1$.

The susceptor 30 is made of a ferromagnetic material having a Curie temperature (Curie point), $T_c$, which substantially corresponds to a temperature at which the growth of desired nanostructures occurs. The Curie temperature $T_c$ is a temperature above which the ferromagnetic material loses its ferromagnetic character and becomes transparent to an RF field. When the susceptor 30 lies within an RF field, it interacts with the RF field. Such an interaction causes the susceptor 30 to absorb the energy of the RF field and therefore causes the temperature of the susceptor 30 to rise. When the temperature of the susceptor 30 rises to the Curie temperature $T_c$, the susceptor 30 becomes transparent to the RF field and then its temperature remains at the Curie temperature $T_c$ as long as the RF filed is being applied.

The susceptor 30 can also be formed in other forms. For example, the susceptor can be formed in a thin Curie point foil mounted on an ultra-low heat conductivity/capacity insulator made of silicate or materials used for space shuttle tiles. The foil may be coated with a non-magnetic shield or higher temperature non-paramagnetic/non-reactive materials to prevent the foil alloy from reacting with the carbon source or feedstock reagents. The non-magnetic shield or higher temperature non-paramagnetic/non-reactive materials includes gold, chromium or the likes. The same design can be employed if the Curie point foil alloy exhibits any independent catalytic activity toward the carbon or feedstock materials. The low thermal mass of the Curie point foil material allows for rapid turnaround between batches in a serial production of nanostructures.

Alternatively, the susceptor 30 may be formed in the form of fine powders of Curie point (ferromagnetic) material coated with a catalyst and support materials as a susceptor. The coated powders are exposed to the feedstock/reactant gases via a fluidized bed or spill/screw assembly. In this embodiment, the reaction container (chamber) and/or screw is made preferably from fused silica or other RF transparent materials. In this embodiment, a foil or deposited coating having the same Curie temperature Tc as the powders would line the container and the screw to eliminate contact cooling.

In operation, the susceptor 30 containing the catalyst 60 is positioned in the reaction zone in the bore 14 of the cylindrical process chamber 10. A carbon feedstock and/or carrier gas is transported into in the reaction zone. The inductive coil 28 is electrically powered with an AC power supply 7 to generate an RF field in the reaction zone. The interaction of the RF field with the susceptor 30 results in an increase of the temperature of the susceptor 30 to the Curie temperature $T_c$ at which desired nanostructures start to grow from the catalyst 60 and the feedstock reagent on the supporting surface 38 of the susceptor 30. By continuously supplying the RF field in the reaction zone, the temperature of the susceptor 30 remains substantially at the Curie temperature $T_c$, thereby allowing the growth of the desired nanostructure to continue at a substantially constant thermal environment.

Figure 3:
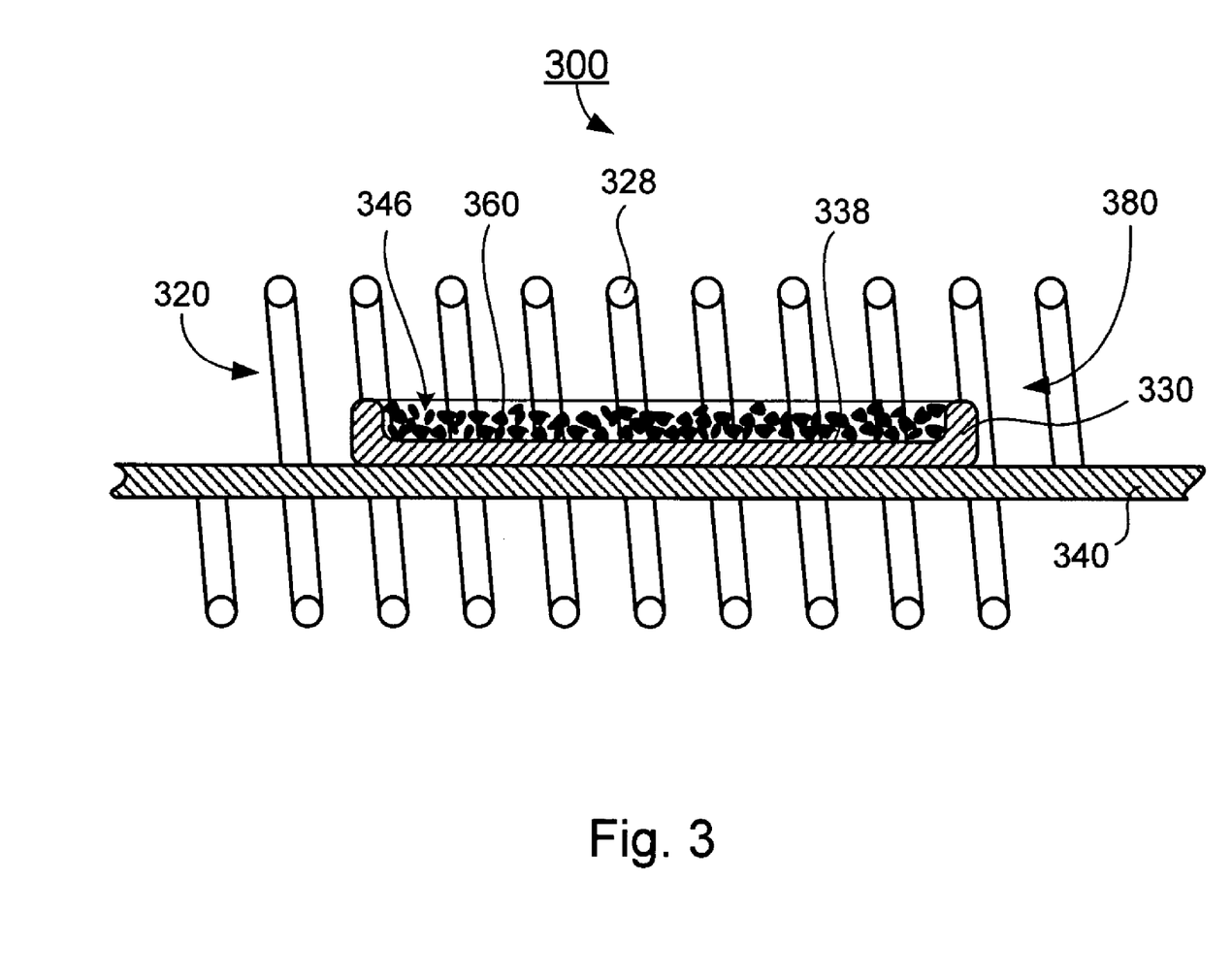
FIG. 3 shows temperature profiles of different types of heating devices for synthesizing nanostructures.

Referring to FIG. 3, an apparatus 300 for synthesizing nanostructures is shown according to another embodiment of the present invention. In the exemplary embodiment, the apparatus 300 includes a heating device 320 that defines a reaction zone 380 therein, and a susceptor 330 made of a ferromagnetic material having a characteristic temperature and placed in the reaction zone 380, where the characteristic temperature substantially corresponds to a temperature at which the growth of desired nanostructures occurs and is substantially equal to a Curie temperature of the ferromagnetic material. As shown in FIG. 3, the susceptor 330 is formed in the form of a plate defining a recess 346 with a supporting surface 338 for supporting a catalyst 360. The susceptor 330 is supported by an ultra-low heat conductivity/capacity insulator 340. The ultra-low heat conductivity/capacity insulator 340 may comprise a material used for space shuttle tiles, or silicate, for examples. The susceptor 330 can be formed in any forms, for example, a thin foil or a boat-like structure. The heating device 320 is adapted for heating the susceptor 330 substantially at the Curie temperature. As shown in FIG. 3, the heating device 320 is in the form of an inductive coil 328. The inductive coil 328 is electrically coupled to an AC power supply (not shown) for generating an electromagnetic field with an RF in the reaction zone 380 to heat the susceptor 330 substantially at the Curie temperature.

Additionally, according to the embodiments of the present invention as disclosed in the specification, the apparatus may includes means for supplying a feedstock reagent and/or carrier gas to the reaction zone, and means for keeping a sufficient amount of the feedstock reagent and/or carrier gas in the reaction zone. The apparatus may also include means for consecutively introducing batches of a catalyst to the susceptor in the reaction zone, where each batch of the catalyst is positioned in the reaction zone for a period of time for the growth of desired nanostructures.

The use of an inductively heating device to heat a susceptor of a ferromagnetic material (alloy) according to the present invention has great advantages over conventional heating processes. For example, for inductively heating a susceptor of a thin foil of ferromagnetic alloy by an RF field, the time for which the temperature of the susceptor rises from an ambient temperature to the Curie temperature $T_c$ is as few as 0.2 seconds. The susceptor is also cooled down almost instantly once the RF field is turned off. However, inductively heating a conventional susceptor made of a non-ferromagnetic material from an ambient temperature to a temperature of reaction may take about 2 to 3 minutes. And classically heating a ferromagnetic susceptor or conventional susceptor from an ambient temperature to a temperature of reaction may take up to about 30 minutes. Therefore, the time required to produce a batch of nanostructures by inductively heating a ferromagnetic susceptor is much less than the time required to produce a similar batch of nanostructures by conventional processes. The use of a ferromagnetic susceptor allows for very low energy consumption during synthesis of desired nanostructures.

Figure 4:
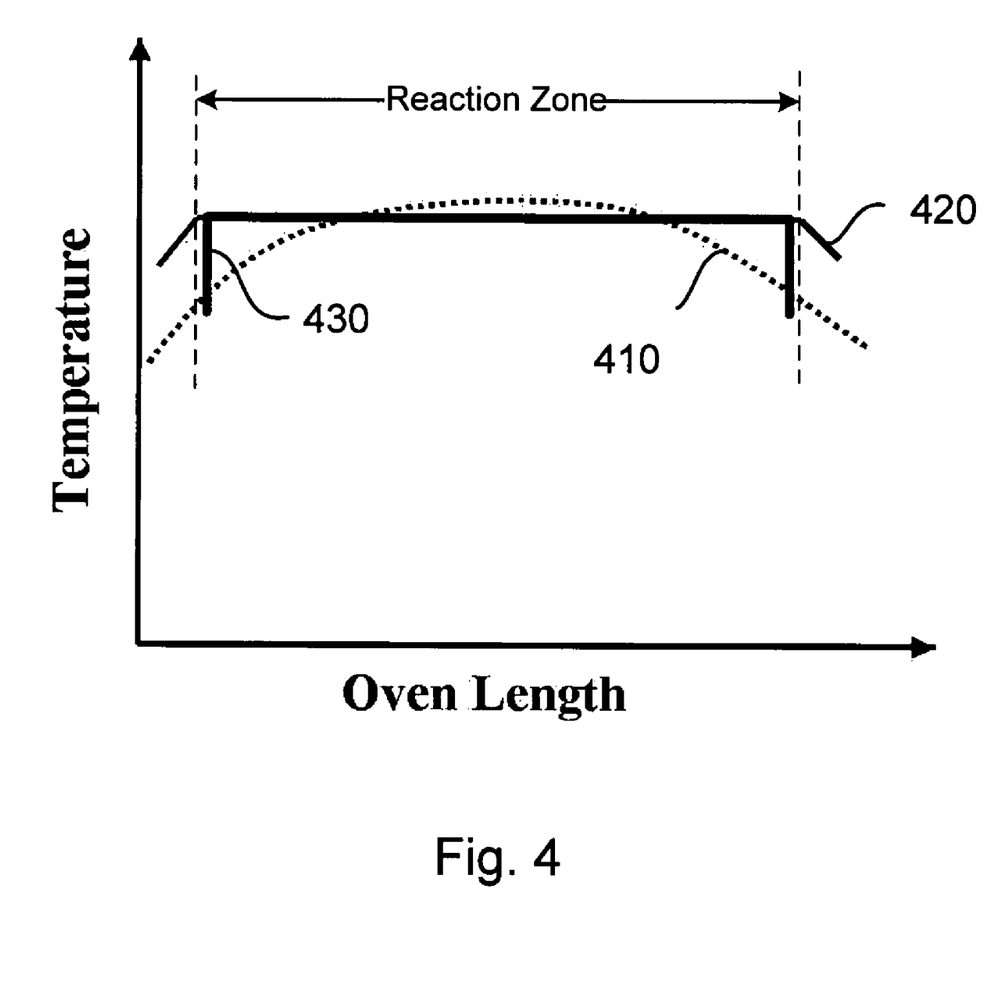
FIG. 4 shows schematically a cross-sectional view of an apparatus for synthesizing nanostructures according to another embodiment of the present invention.

Furthermore, when a ferromagnetic susceptor is inductively heated by an RF field, the temperature of the ferromagnetic susceptor is uniformly distributed over the reaction zone, which is, for example, indicated by the temperature distribution 430 in FIG. 4. As a comparison, FIG. 4 also shows the temperature distributions 410 and 420 of a conventional susceptor heated by a classical oven and an inductive heating device, respectively. These distributions indicate the thermal stability in the reaction zone. The present invention allows a substantially uniform temperature distribution 430 longitudinally across the reaction zone. That is, no temperature hysteresis exists in the reaction zone, which indicates thermal stability and temperature accuracy is independent of operational parameters in the reaction zone. However, a classical heating process results in a non-uniform gradient temperature distribution 410 across the reaction zone. The lack of uniformity in a classical heating process is directly responsible for a lack of purity in reaction products.

Inductive heating can be used for a plurality of metallic catalysts on metal oxide supports and carrier/hydrocarbon or carrier/heteroatom source gas combinations. The specific types of nanostructures that are produced are a function of a chosen catalyst and a carrier gas (e.g., argon, nitrogen, hydrogen, helium, or mixtures of these gases in various ratios). For carbon nanostructures, hydrocarbon feedstock can be gaseous (e.g., methane, ethylene, acetylene, or the likes), liquid (e.g., xylene, benzene, n-hexane, alcohol, or the like), or solid (e.g., anthracene, naphthalene, or the likes). The above-mentioned reasons make inductive heating suitable for large-scale carbon nanostructure production. Additionally, embodiments of the present invention can also be practiced with modifications for the assembly of non-carbon based nanomaterials.

Figure 5:
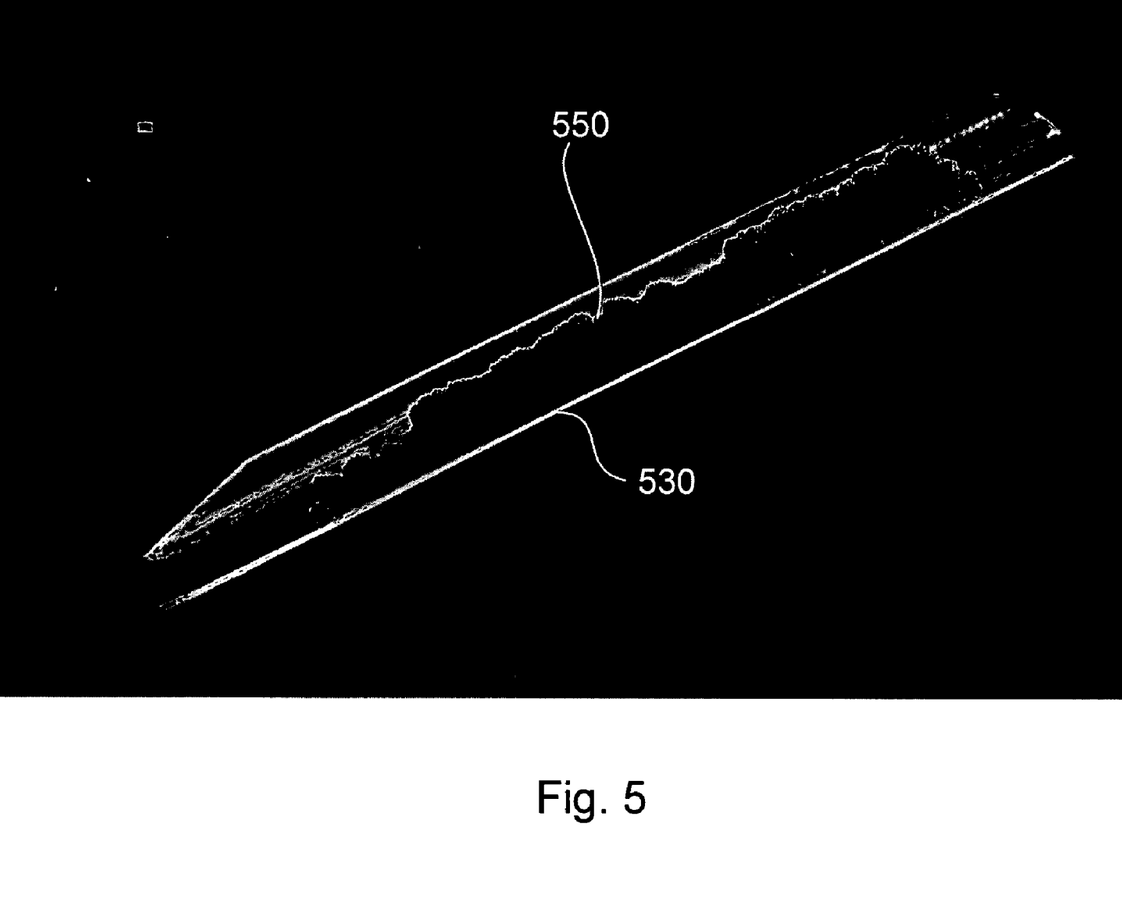
FIG. 5 shows synthesized carbon nanotubes according to one embodiment of the present invention.

FIG. 5 shows an image of multi wall carbon nanotubes (MW-CNTs) 550 grown in a stainless steel laboratory scoopula (susceptor) 530 by inductively heating the scoopula substantially at its Curie temperature according to the present invention. The scoopula 530 was made of a Curie Poking alloy having a Curie temperature Tc=640° C., a temperature at which the growth of MW-CNTs occurs. The scoopula 530 was placed in an RF field generated by an inductive coil and heated instantly to the Curie temperature Tc=640° C. with the RF field. Without adding a catalyst or support, carbon source gases were introduced, and no reaction between carbon source gases and the scoopula 530 was found. Repeating the process with the catalyst and support presented in the scoopula 530, the MW-CNTs were formed on the catalyst. It should be noted that SW-CNTs, MW-CNTs, carbon nanofibers (CNFs), Boron-nitride nanotubes, Boron-carbon nanotubes, and other nanoparticles may be optimally synthesized at temperatures different from 640° C. so that susceptor foils or particles with corresponding Curie temperatures Tc would be required for each application. It is important to have special purpose alloys for various nanostructures. These alloys can be fabricated as foil, wire, rod, or plate. The Curie temperature Tc of a ferromagnetic alloy can be adjusted by incremental adjustment of the alloy composition or annealing process.

A significant aspect of practicing the present invention is that RF energy is used to inductively heat a ferromagnetic susceptor containing a catalyst to a Curie temperature of the susceptor directly, which is coincident with the reaction temperature of the catalyst. An apparatus having a ferromagnetic susceptor with inductive heating enables the control of most of the physical and chemical parameters that influence the nucleation and the growth of highly pure carbon nanostructures.

Thus, according to the present invention, inductive heating directly heats a susceptor made of a ferromagnetic material, therefore making methods that utilize inductive heating exceptionally efficient. Another advantage of inductive heating is that the time required for increasing the temperature of the susceptor from an ambient temperature to the Curie temperature of the ferromagnetic material, which corresponds to the temperature of reaction of catalyst particles, is much shorter in comparison to conventional heating methods. In a further comparison with conventional heating methods, the inductive heating presents a uniform temperature distribution in the reaction zone. Therefore, the invented apparatus and methods for synthesizing nanostructures assure temperature reproducibility, stability, and accuracy for the growth of desired nanostructures.

Among others things, the current invention can be applied for synthesis processes involving (i) chemical vapor deposition of non-carbon-based nanostructures such as those using boron and nitrogen; (ii) elemental substitution of already formed nanotube or nanofiber structures, such as those involving boron substitution for carbon atoms to form boron-carbon nanostructures; (iii) post-formation layering or other treatment of nanostructures. In the elemental substitution, layering, or treatment processes, heat from the Curie point foil or particle is not located precisely at the point of catalytic activity as in the CCVD-based primary formation of carbon or other nanostructures. Therefore precise temperature control may not be achieved. In these instances, a major benefit of exploiting the Curie point principle would be the drastically reduced energy costs needed to achieve a useful synthesis temperature.

Any of the above-mentioned embodiments alone or in combination will permit the continuous production of nanostructures. Further, any other methods that achieve the same result by controlling the above-mentioned pertinent factors are encompassed within the scope of this invention.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A method for synthesizing nanostructures, comprising the steps of:
   a. providing a nanostructure reactor having a reaction zone and a susceptor placed in the reaction zone, wherein the susceptor is made of a ferromagnetic material having a Curie temperature and contains a catalyst;
   b. supplying a feedstock reagent to the reaction zone;
   c. heating the susceptor to increase the temperature of the susceptor to the Curie temperature; and
   d. keeping the susceptor substantially at the Curie temperature for a period of time for the growth of desired nanostructures from the catalyst and the feedstock reagent.

2. The method of claim 1, wherein the heating step comprises the step of inductively heating the susceptor with an electromagnetic field with a radio frequency (RF).

3. The method of claim 1, further comprising the step of optimizing the characteristic temperature for the growth of the desired nanostructures.

4. The method of claim 3, wherein the optimizing step comprises the step of selecting the ferromagnetic material with a Curie temperature that substantially corresponds to a temperature at which the growth of the desired nanostructures occurs.

5. The method of claim 1, further comprising the step of maintaining a sufficient amount of the feedstock reagent in the reaction zone.

6. The method of claim 1, wherein the susceptor comprises a foil or plate of the ferromagnetic material, and wherein the foil or plate has a surface for nanostructures to grow on the surface.

7. The method of claim 6, wherein the foil or plate of the ferromagnetic material is coated with a non-magnetic conductive material.

8. The method of claim 1, wherein the susceptor comprises a bed of powders made from the ferromagnetic material.

9. The method of claim 8, wherein each of the powders is coated with a catalyst and support materials.

10. A method for synthesizing nanostructures, comprising the steps of:
   a. providing a susceptor containing a catalyst, wherein the susceptor is made of a ferromagnetic material having a characteristic temperature; and
   b. heating the susceptor substantially at the characteristic temperature for the growth of desired nanostructures from the catalyst; and
   c. supplying a feedstock reagent.

11. A method for synthesizing nanostructures, comprising the steps of:
   a. providing a susceptor containing a catalyst, wherein the susceptor is made of a ferromagnetic material having a characteristic temperature; and
   b. heating the susceptor substantially at the characteristic temperature for the growth of desired nanostructures from the catalyst; and
   c. optimizing the characteristic temperature for the growth of the desired nanostructures.

12. The method of claim 11, wherein the optimizing step comprises the step of selecting the ferromagnetic material with a Curie temperature that substantially corresponds to a temperature at which the growth of the desired nanostructures occurs.

13. A method for synthesizing nanostructures, comprising the steps of:
   a. providing a susceptor containing a catalyst, wherein the susceptor is made of a ferromagnetic material having a characteristic temperature; and
   b. heating the susceptor substantially at the characteristic temperature for the growth of desired nanostructures from the catalyst, wherein the heating step comprises the steps of inductively heating the susceptor to increase temperature of the susceptor to the characteristic temperature; and keeping the susceptor substantially at the characteristic temperature for a period of time for the growth of the desired nanostructures.

14. The method of claim 13, wherein the inductively heating step is performed with an electromagnetic field with a radio frequency (RF).

15. A method for synthesizing nanostructures, comprising the steps of heating a susceptor containing a catalyst substantially at a characteristic temperature at which the growth of desired nanostructures occurs, wherein the susceptor is made of a ferromagnetic material with a Curie temperature that is substantially equal to the characteristic temperature, and supplying a feedstock reagent to the susceptor.

16. A method for synthesizing nanostructures, comprising the steps of heating a susceptor containing a catalyst substantially at a characteristic temperature at which the growth of desired nanostructures occurs, wherein the susceptor is made of a ferromagnetic material with a Curie temperature that is substantially equal to the characteristic temperature, and wherein the heating step comprises the steps of inductively heating the susceptor to increase temperature of the susceptor to the characteristic temperature; and keeping the susceptor substantially at the characteristic temperature for a period of time for the growth of the desired nanostructures.

17. The method of claim 16, wherein the inductively heating step is performed with an electromagnetic field with a radio frequency (RF).

* * * * *